(12) United States Patent
Dou et al.

(10) Patent No.: US 12,284,789 B2
(45) Date of Patent: Apr. 22, 2025

(54) HIGHLY INTEGRATED MOBILE ENERGY STORAGE SYSTEM

(71) Applicant: SUNGROW POWER SUPPLY CO., LTD., Anhui (CN)

(72) Inventors: Hongsheng Dou, Anhui (CN); Guohong Li, Anhui (CN); Zengfu Ding, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 269 days.

(21) Appl. No.: 17/878,764

(22) Filed: Aug. 1, 2022

(65) Prior Publication Data

US 2023/0014621 A1     Jan. 19, 2023

Related U.S. Application Data

(62) Division of application No. 16/532,013, filed on Aug. 5, 2019, now Pat. No. 11,404,739.

(30) Foreign Application Priority Data

Aug. 27, 2018 (CN) .......................... 201821389453.8

(51) Int. Cl.
*H01M 10/60* (2014.01)
*H01M 10/627* (2014.01)
(Continued)

(52) U.S. Cl.
CPC ........ *H05K 7/2059* (2013.01); *H01M 10/627* (2015.04); *H01M 10/663* (2015.04);
(Continued)

(58) Field of Classification Search
CPC .. H01M 50/298; H01M 50/271; H01M 50/20; H01M 50/204; H01M 50/207;
(Continued)

(56) References Cited

U.S. PATENT DOCUMENTS

| | | | | |
|---|---|---|---|---|
| 2007/0184339 A1* | 8/2007 | Scheucher | ............. | B60L 58/22 429/99 |
| 2014/0017528 A1* | 1/2014 | Uehara | ............ | H01M 10/4257 429/61 |
| 2014/0186676 A1* | 7/2014 | Ebisawa | ............... | H01M 50/20 429/100 |

FOREIGN PATENT DOCUMENTS

JP         5849665 B2      2/2016

OTHER PUBLICATIONS

Second Canadian Office Action regarding Application No. 3,049,552 dated Nov. 10, 2021.

* cited by examiner

*Primary Examiner* — Raymond Alejandro
(74) *Attorney, Agent, or Firm* — Harness, Dickey & Pierce, P.L.C.

(57) ABSTRACT

A highly integrated mobile energy storage system is provided, which includes a container and battery racks. The battery racks are arranged in two rows along a length direction of the container, and the two rows of the battery racks are arranged back to back. For each of the two rows of battery racks, a maintenance door is arranged at a wall of the container close to the row of battery racks. In a case that a battery rack needs to be maintained, it is just required to open the maintenance door to maintain the battery rack. Since the two rows of battery racks are arranged back to back, no maintenance passage is required, thereby reducing a floor space along a width direction of the container, thus reducing the floor space of the system.

9 Claims, 5 Drawing Sheets

(51) Int. Cl.
*H01M 10/663* (2014.01)
*H01M 50/20* (2021.01)
*H01M 50/271* (2021.01)
*H01M 50/298* (2021.01)
*H05K 7/14* (2006.01)
*H05K 7/20* (2006.01)

(52) U.S. Cl.
CPC ......... *H01M 50/20* (2021.01); *H01M 50/271* (2021.01); *H01M 50/298* (2021.01); *H05K 7/14* (2013.01); *H01M 2220/10* (2013.01)

(58) Field of Classification Search
CPC .. H01M 50/22; H01M 10/627; H01M 10/663; H01M 2220/10; H05K 7/14; H05K 7/2059
See application file for complete search history.

HIGHLY INTEGRATED MOBILE ENERGY STORAGE SYSTEM

The present application is a divisional application of U.S. patent application Ser. No. 16/532,013, filed Aug. 5, 2019 (now U.S. Pat. No. 11,404,739, issued Aug. 2, 2020), which claims priority to Chinese Patent Application No. 201821389453.8, titled "HIGHLY INTEGRATED MOBILE ENERGY STORAGE SYSTEM", filed on Aug. 27, 2018, with the Chinese Patent Office, which is incorporated herein by reference in its entirety.

FIELD

The present disclosure relates to the technical field of box-type energy storage device, and in particular to a highly integrated mobile energy storage system.

BACKGROUND

A mobile energy storage system is widely used in wind-photovoltaic-storage hybrid micro-grid due to its advantages such as a high energy density, a small floor space, convenient installation, a short construction period and convenient transportation.

Reference is made to FIG. 1, which is a schematic structural view of a mobile energy storage system according to the conventional technology.

The mobile energy storage system includes a container 100, battery racks 200, a power conversion system (PCS) 300, a battery control panel (BCP) 400, a heating, ventilation and air conditioning (HVAC) system 500, and a fire protection system 600. A device compartment 101 and a battery compartment 102 are arranged inside the container 100. The PCS 300 and the BCP 400 are arranged in the device compartment 101, the battery racks 200 are arranged in two rows in the battery compartment 101 along a length direction of the container 100, and the two rows of battery racks 200 are arranged face to face. In order to facilitate maintenance, a maintenance passage with a sufficient width is required between the two rows of battery racks 200, which increase the floor space of the system.

In addition, wire holes are all arranged in a base of the container. In order to facilitate wiring at an operation place, it is required to raise the base of the container or deeply tear up the land, which increases the construction period and the project cost. In addition, the mobile energy storage system is fixed by welding a foot member and a bottom beam of the container with a pre-embedded flat steel, which has a high demand on the tools (a welding machine) and the operation condition (energization), therefore, the difficulty in operation is increased.

Therefore, a technical problem urgently to be solved by those skilled in the art is how to reduce the floor space of the system.

SUMMARY

In view of the above, a highly integrated mobile energy storage system is provided according to the embodiments of the present disclosure, which has a reduced floor space.

The highly integrated mobile energy storage system includes a container and battery racks. The battery racks are arranged in two rows along a length direction of the container, and the two rows of battery racks are arranged back to back. For each of the two rows of battery racks, a maintenance door is arranged at a wall of the container close to the row of battery racks.

In an embodiment, the highly integrated mobile energy storage system further includes L-shaped fixed adapters. One side of each of the L-shaped fixed adapters is fixed to an outer surface of a wall of the container, and the other side of the L-shaped fixed adapter is used to fix the container to at an operation place.

In an embodiment, in the highly integrated mobile energy storage system, the L-shaped fixed adapters are arranged on outer surfaces of walls along the length direction of the container, and for each of the outer surfaces of the walls, three L-shaped fixed adapters are arranged.

In an embodiment, in the highly integrated mobile energy storage system, the container is provided with a wire hole at a corner.

In an embodiment, in the highly integrated mobile energy storage system, the wire hole includes a first wire hole arranged in a base of the container and extending through the base of the container.

In an embodiment, in the highly integrated mobile energy storage system, the wire hole further includes a second wire hole and a third wire hole. The second wire hole is arranged in a wall along a width direction of the container and extends through the wall along the width direction of the container, and the third wire hole is arranged in the wall along the length direction of the container and extends through the wall along the length direction of the container.

In an embodiment, in the highly integrated mobile energy storage system, the container is further provided with a device compartment, and a power conversion system (PCS) is arranged in the device compartment.

In an embodiment, in the highly integrated mobile energy storage system, the device compartment and a battery control panel (BCP) are arranged adjacent to each other along the width direction of the container.

In an embodiment, in the highly integrated mobile energy storage system, a heating, ventilation and air conditioning (HVAC) system is arranged on a wall of the container.

It can be seen from the above technical solution that, in the highly integrated mobile energy storage system according to the embodiments of the present disclosure, the two rows of battery racks are arranged back to back, and for each of the two rows of battery racks, a maintenance door is arranged at a wall of the container close to the row of battery racks. In a case that a battery rack needs to be maintained, it is just required to open the maintenance door to maintain the battery rack. Since the two rows of battery racks are arranged back to back, no maintenance passage is required, thereby reducing a floor space along a width direction of the container, thus reducing the floor space of the system.

BRIEF DESCRIPTION OF THE DRAWINGS

In order to illustrate technical solutions in the embodiments of the present disclosure or in the conventional technology clearly, drawings to be used in the description of the embodiments or the conventional technology are briefly described below. It is apparent that the drawings in the following description only show some embodiments of the present disclosure, and other drawings may be obtained by those skilled in the art according to these drawings without any creative work.

Figure 1:
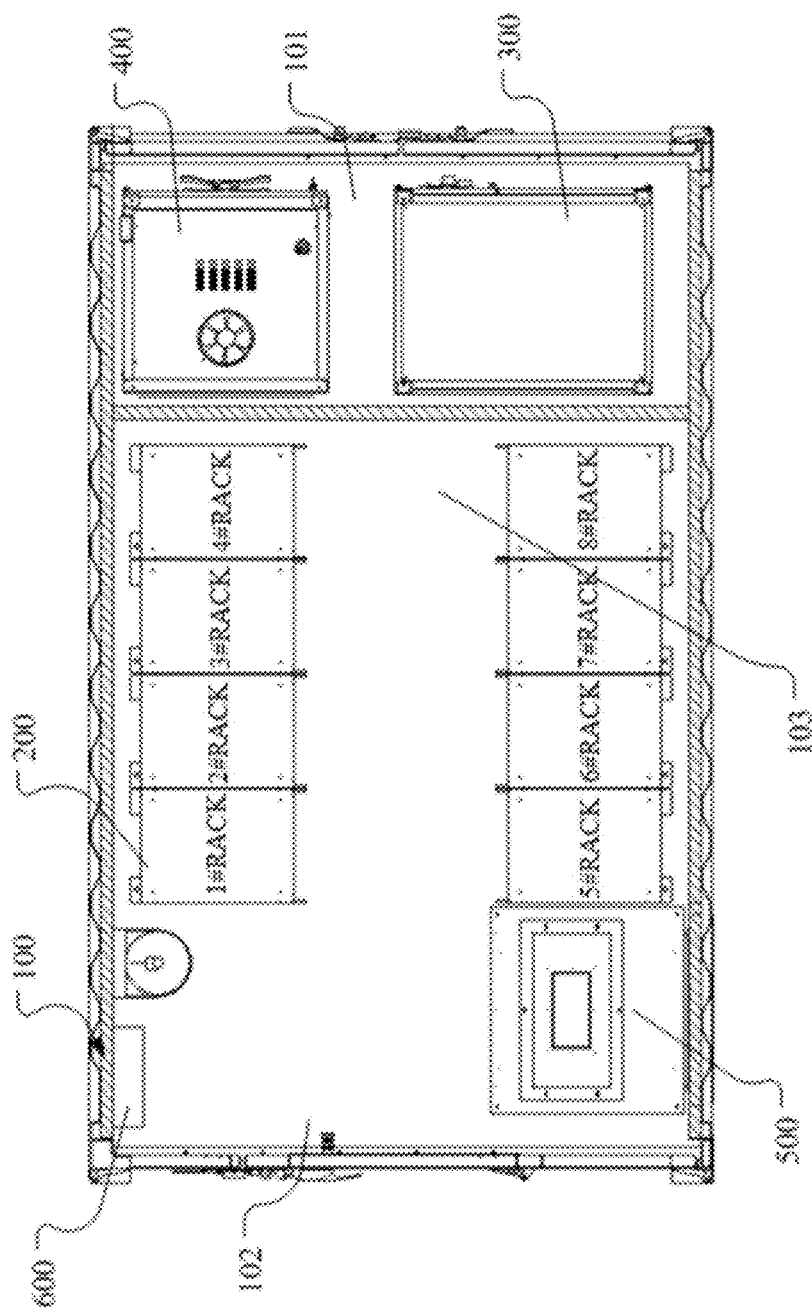
FIG. 1 is a sectional structural view of a highly integrated mobile energy storage system according to the conventional technology.

Reference numbers in the drawings are listed as follows:
100 container
200 battery rack
300 power conversion system (PCS)
400 battery control panel (BCP)
500 heating, ventilation and air
600 fire protection system conditioning (HVAC)
101 device compartment
102 battery compartment
103 maintenance passage
104 maintenance door
105 L-shaped fixed adapter
106 first wire hole
107 second wire hole
108 third wire hole

DETAILED DESCRIPTION OF EMBODIMENTS

A highly integrated mobile energy storage system is provided according to the embodiments of the present disclosure, which has a reduced floor space.

Embodiments described hereinafter do not intend to limit the scope of the present disclosure as defined in the claims. Further, the configurations described in the following embodiments are not necessarily limited to the solutions of the present disclosure defined in the claims.

Figure 2:
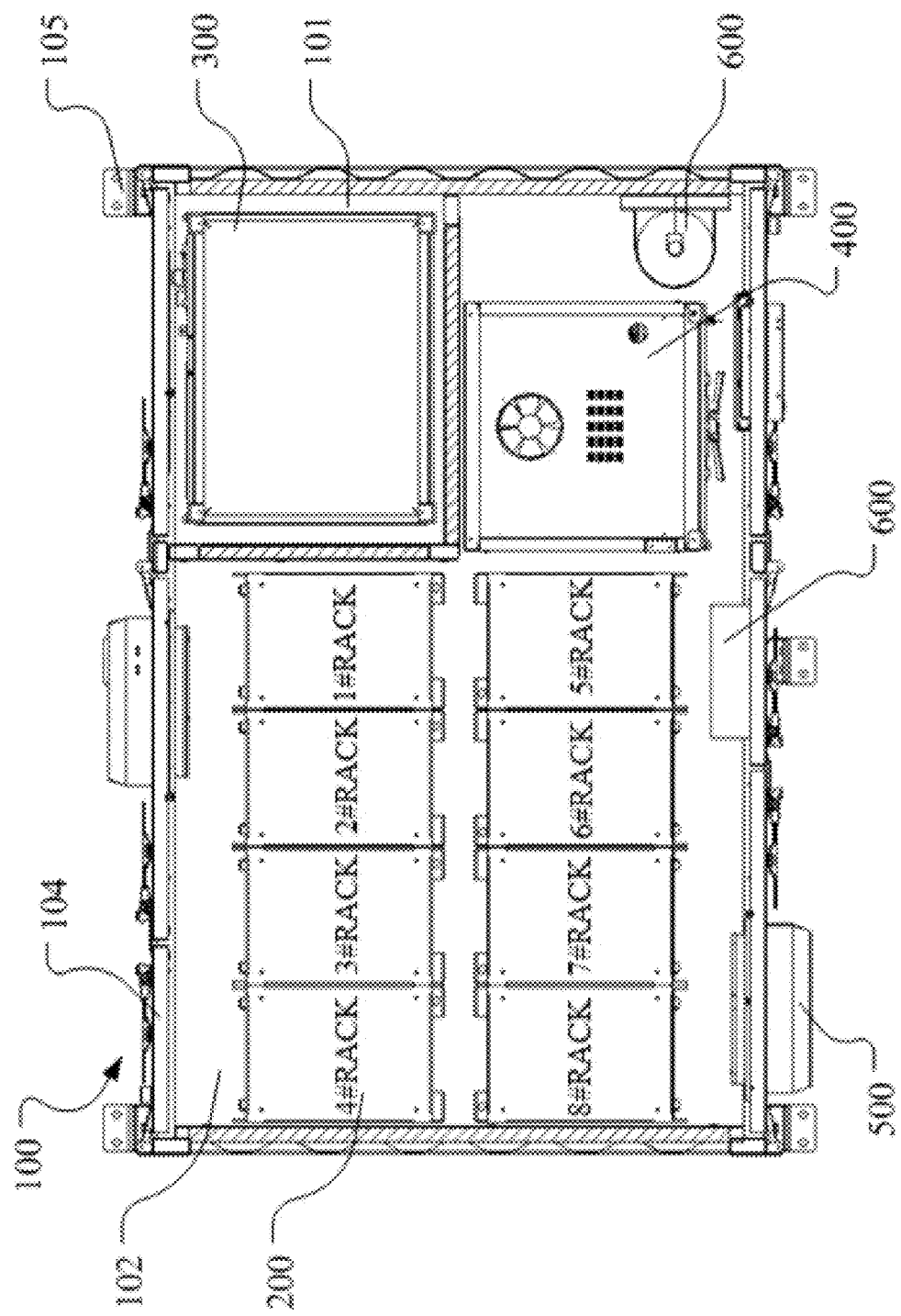
FIG. 2 is a schematic top view of a highly integrated mobile energy storage system according to an embodiment of the present disclosure.
Figure 3:
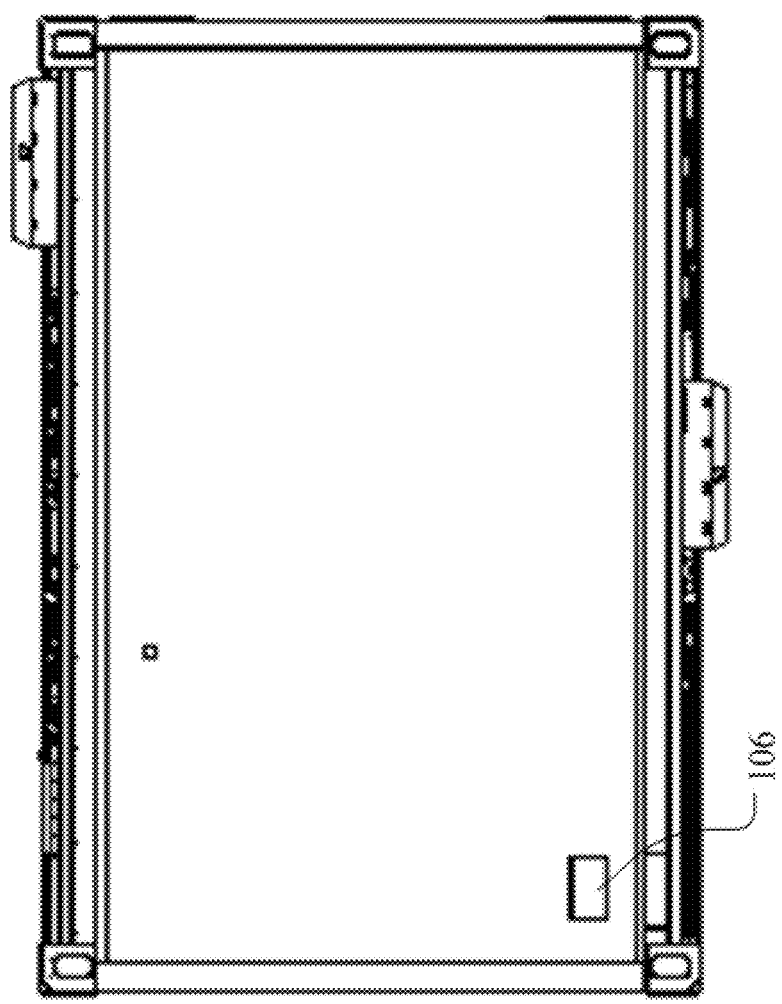
FIG. 3 is a schematic bottom view of a highly integrated mobile energy storage system according to an embodiment of the present disclosure.
Figure 4:
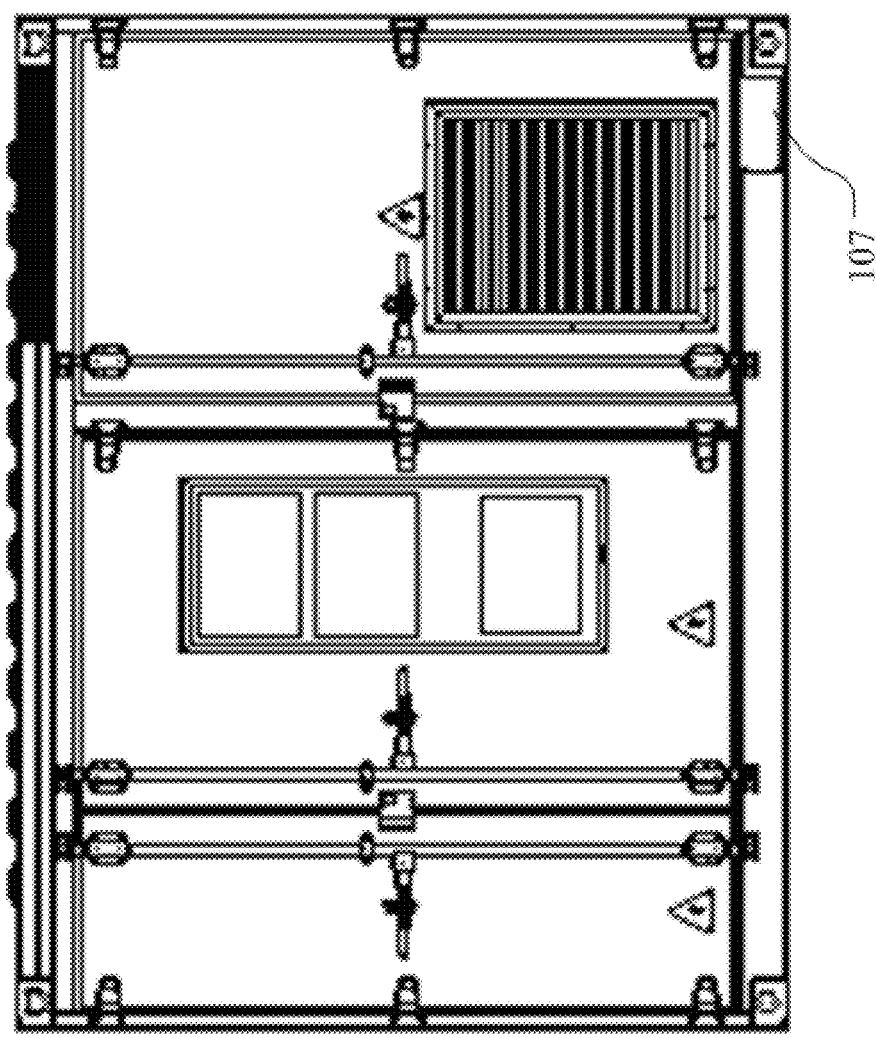
FIG. 4 is a schematic side view of a highly integrated mobile energy storage system according to an embodiment of the present disclosure.
Figure 5:
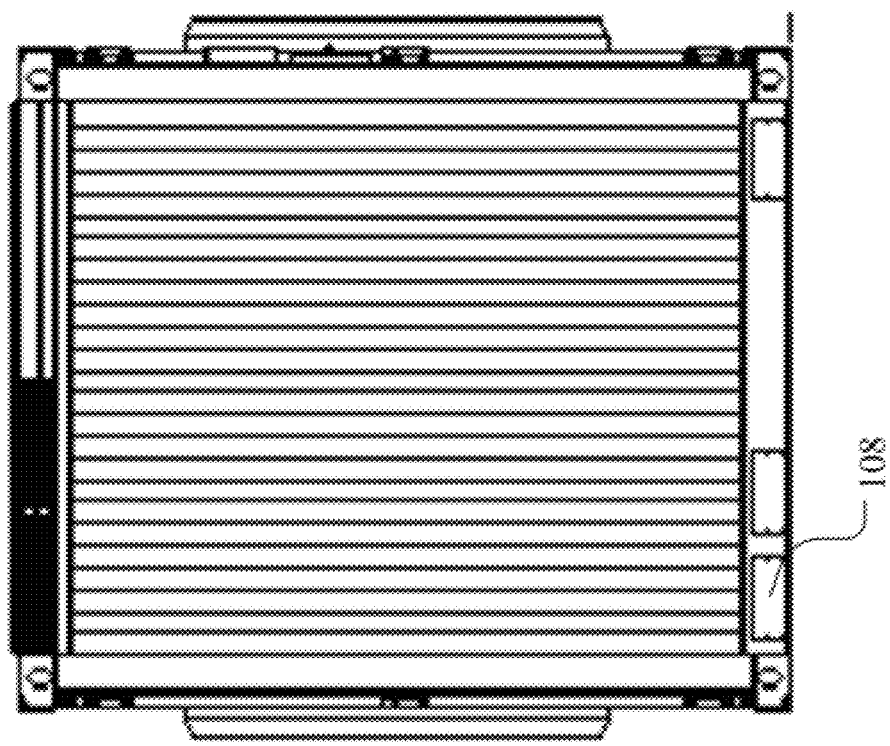
FIG. 5 is a schematic back view of a highly integrated mobile energy storage system according to an embodiment of the present disclosure.

Referring to FIG. 2 to FIG. 5, according to an embodiment of the present disclosure, the highly integrated mobile energy storage system includes a container 100 and battery racks 200. The battery racks 200 are arranged in two rows along a length direction of the container 100. The two rows of battery racks 200 are arranged back to back, and for each of the two rows of battery racks 200, a maintenance door 104 is arranged at a wall of the container 100 close to the row of battery racks 200.

In a case that a battery rack 200 needs to be maintained, it is just required to open the maintenance door 104 to maintain the battery rack 200. Since the two rows of battery racks 200 are arranged back to back, no maintenance passage is required, thereby reducing a floor space along a width direction of the container 100, thus reducing the floor space of the system.

In another embodiment of the present disclosure, the highly integrated mobile energy storage system further includes L-shaped fixed adapters 105. One side of each of the L-shaped fixed adapters 105 is fixed to an outer surface of a wall of the container 100, and the other side of the L-shaped fixed adapter 105 is used to fix the container to an operation place.

With this arrangement, the highly integrated mobile energy storage system may be fixed to the operation place via the L-shaped fixed adapters 105. Therefore, it is unnecessary to perform welding and pre-embed a flat steel, thereby reducing the difficulty in the operation.

Further, the L-shaped fixed adapters 105 are arranged on outer surfaces of walls along the length direction of the container 100, and for each of the outer surfaces of the walls along the length direction of the container 100, three L-shaped fixing adapters 105 are arranged.

In order to facilitate wiring, the container 100 is provided with a wire hole at a corner. In an embodiment of the present disclosure, the wire hole includes a first wire hole 106 arranged in a base of the container 100, and the first wire hole 106 extends through the base of the container 100.

Further, the wire hole further includes a second wire hole 107 and a third wire hole 108. The second wire hole 107 is arranged in a wall along the width direction of the container 100 and extends through the wall along the width direction of the container 100, the third wire in hole is arranged in a wall along the length direction of the container 100 and extends through the wall along the length direction of the container 100.

The first wire hole 106, the second wire hole 107 and the third wire hole 108 are arranged respectively on three surfaces of the container 100 in a three-way type, such that wiring is performed in many ways, thereby reducing the difficulty in wiring and reducing the operation cost.

In the highly integrated mobile energy storage system described above, the container 100 is further provided with a device compartment 101 in which the PCS 300 is arranged. Compared with the conventional technology, in the embodiment of the present disclosure, only the PCS 300 is arranged in the device compartment 101. The battery compartment 102 occupies the remaining space in the container 100 other than that of the device compartment 101, and the battery racks 200, the battery control panel (BCP) 400, the heating, ventilation and air conditioning (HVAC) system 500, and the fire protection system 600 are all arranged in the battery compartment 102.

In the conventional technology, the power conversion system (PCS) 300 and the BCP 400 are both arranged in the device compartment 101. In the present disclosure, the BCP 400 is arranged outside the device compartment 101. In order to further reduce the floor space of the system, the device compartment 101 and the BCP 400 are arranged adjacent to each other along the width direction of the container 100. In the device compartment 101, a maintenance door 104 is further arranged in a wall of the container 100 for maintenance of the battery rack 200.

In order to further reduce the floor space of the system, the HVAC 500 is arranged on a wall of the container 100. Compared with the conventional technology in which the HVAC 500 is arranged in the battery compartment 102, the space in the container 100 is utilized appropriately.

The fire protection system 600 of the highly integrated mobile energy storage system may be arranged according to the technical solutions in the conventional technology.

The embodiments are described above, such that those skilled in the art can perform or use the present disclosure. Various modifications to these embodiments are apparent to those skilled in the art, and the general principles defined herein may be implemented in other embodiments without departing from the spirit or scope of the present disclosure. Therefore, the present disclosure is not limited to the embodiments described in the present disclosure but confirms to a widest scope in accordance with principles and novel features disclosed in the present disclosure.

The invention claimed is:

1. An integrated mobile energy storage system, comprising:
 a container having a pair of sidewalls that extend in a length direction of the container and a pair of sidewalls that extend in a width direction of the container; and
 a plurality of battery racks positioned in the container,
 wherein the plurality of battery racks are arranged in two rows along the length direction of the container,
 each battery rack of the plurality of battery racks has a front side that is configured to be serviced and a back side,
 the two rows of battery racks are arranged in a way that the back side of each of plurality of battery racks in one row faces and is immediately adjacent to the back side of each of the plurality of battery racks in the other row and such that the front side of each of the plurality of battery racks in each row faces a respective sidewall that extends in the length direction, and
 a maintenance door is arranged on at least one of the sidewalls that extends in the length direction of the container, the maintenance door being configured to be opened to access the front sides of the plurality of battery racks to maintain the plurality of battery racks.

2. The integrated mobile energy storage system according to claim 1, further comprising L-shaped fixed adapters, wherein one side of each of the L-shaped fixed adapters is fixed to an outer surface of a wall of the container, and another side of the L-shaped fixed adapter is used to fix the container to an operation place.

3. The integrated mobile energy storage system according to claim 2, wherein the L-shaped fixed adapters are arranged on outer surfaces of walls along the length direction of the container, and for each of the outer surfaces of the walls, three L-shaped fixed adapters are arranged.

4. The integrated mobile energy storage system according to claim 1, wherein the container is provided with a wire hole at a corner.

5. The integrated mobile energy storage system according to claim 4, wherein the wire hole comprises a first wire hole arranged in a base of the container and extending through the base of the container.

6. The integrated mobile energy storage system according to claim 5, wherein the wire hole further comprises a second wire hole and a third wire hole, and the second wire hole is arranged in a wall along a width direction of the container and extends through the wall along the width direction of the container, and the third wire hole is arranged in the wall along the length direction of the container and extends through the wall along the length direction of the container.

7. The integrated mobile energy storage system according to claim 1, wherein the container is further provided with a device compartment, and a power conversion system (PCS) is arranged in the device compartment.

8. The integrated mobile energy storage system according to claim 7, wherein the device compartment and a battery control panel (BCP) are arranged adjacent to each other along a width direction of the container.

9. The integrated mobile energy storage system according to claim 1, wherein a heating, ventilation and air conditioning (HVAC) system is arranged on a wall of the container.

* * * * *